United States Patent Office 3,516,848
Patented June 23, 1970

3,516,848
PROCESS AND SOLUTION FOR SENSITIZING SUBSTRATES FOR ELECTROLESS PLATING

Donald Gardner Foulke, Watchung, Plainfield, and Atkin Simonian, Fort Lee, N.J., assignors to Sel-Rex Corporation, Nutley, N.J., a corporation of New Jersey
No Drawing. Filed Oct. 18, 1965, Ser. No. 497,504
Int. Cl. C23c *3/00, 17/00*
U.S. Cl. 117—47 4 Claims

ABSTRACT OF THE DISCLOSURE

The invention relates to an improved process of catalyzing substrates preparatory to plating by the electroless process and is characterized by the step of catalyzing said substrate by treating it with an aqueous solution of alkali gold sulfite.

This invention relates to a process for sensitizing substrates to receive electroless platings and to the solution for accomplishing the sensitization.

Although the invention is particularly useful in connection with processes of plating substrates which are nonconductors and semi-conductors it is also useful in connection with processes for plating metals by elecroless processes. Again, although the process is especially useful in connection with the plating of copper by the electroless method, it is also useful for plating of other metals by the electroless methods. A fairly comprehensive survey of the various electroless methods of plating by Edward B. Saubestre appeared in the "Metal Finishing" June–September 1962, June, pp. 67–73, July, pp. 49–53, August, pp. 45–49 and September, pp. 59–63.

There has been an increasing need to plate plastic, ceramic and other non-conducting materials with metal coatings. In some cases this is done to provide circuits on a non-conductor. In other cases it is desired to plate through holes in a copper-plastic-copper laminated board to connect circuits on either side. In other cases portions of or the entire plastic article is electroplated with copper, nickel and chromium or other decorative finish after an initial conductive coating is laid down upon the plastic. Usually the first deposit laid down on the non-conductor is an electroless copper or electroless nickel. This may be followed, after sufficient thickness has been built up so that a reasonable current can be carried by the conducting film, by a coating of copper, nickel or other metal laid down by electroplating.

This invention is concerned with a method of and bath for catalyzing the deposition of metals on poorly conductive materials. The usual method for providing an electroless metal coating on a non-conducting or semi-conducting substrate includes the steps of cleaning the substrate; rinsing; then immersing in a stannous salt solution, usually a stannous chloride; then immersing in a catalytic solution which is capable of causing the metal to be plated from the electroless bath on the plastic, for example a solution of silver nitrate, gold chloride or palladium chloride.

It is often difficult to get uniform results by the steps outlined above, particularly when plating through holes and on the copper circuits on either or both sides of printed circuit boards. Oftentimes, the adhesion to the copper is poor and the subsequent electroless as well as the electroplated metal can be rubbed off the copper metal easily. This is true also for plastic parts with metal inserts.

Among the objects of this invention is to provide a catalyzing solution which will insure good adhesion of subsequent metallic coatings on plastics and on metal substrates.

Among other objects of the invention is to provide an improved method for catalyzing the surface of a substrate, preparatory to depositing metals thereon by an electroless plating composition.

This invention is based on the discovery that by substituting a gold sulfite solution for the various catalyzing solutions employed heretofore such as silver nitrate, gold chloride and palladium chloride solutions, the adherence of the subsequently deposited metal by the electroless process is good. The gold sulfite solution can be made by the process of U.S. Pat. No. 3,057,789.

The exact formula for the complex gold sulfite is not known, but it is believed to be $M_3[Au(SO_3)_2]$, where M is an alkali metal or ammonium.

Below a pH of about 8 the gold sulfite solution is unstable so the catalytic solution should be adjusted to a pH above 8.0 by adding alkali. The preferred pH range is 10 to 14. Excess alkali sulfiite will contribute to the stability of the bath. The gold content of the solution for the purposes of the present invention is not critical, less than 0.01 g./l. being sufficient to catalyze the deposition of the metals on the surfaces. However, to provide a reasonable reserve in the bath, the concentration preferred is generally about 1 g./l. Much higher concentrations may be used, but this is uneconomical because of drag-out losses.

A number of electroless baths have been described in the literature (as cited above for example) and any of these may be used to lay down the metal deposit. The two disclosed in the examples which follow are illustrative and are not be considered as limiting the invention to the data given.

Example 1

A printed circuit board with a hole drilled through the board was cleaned by dipping in a mild alkaline cleaner, brushed with pumice, thoroughly rinsed, etched in a cuprous chloride-hydrochloric acid solution, then immersed in a solution of 5 g./l. of stannous chloride in 30% v./v. hydrochloric acid for 5 minutes, rinsed and immersed in a catalyzer solution containing 1.0 g./l. of gold as sodium gold sulfite for 5 minutes. After two rinses the printed circuit was immersed in a proprietary electroless copper solution containing disodium copper EDTA, 200 g./l.; disodium EDTA, 150 g./l., formaldehyde, 20 g./l.; and potassium hydroxide, 70 g./l. for 10 minutes after which the printer circuit was electroplated in a copper fluoborate bath for 10 minutes. The copper deposit adhered to both the electroless deposited copper and to the plastic, giving a good connection through the hole.

Example 2

A plastic panel of the thermoset type with a flush insert of copper was cleaned, roughened, sensitized in stannous chloride, rinsed and immersed in a catalyst solution containing 0.1 g./l. of gold as potassium gold sulfite. After a double rinse in water, the sensitized and catalyzed plastic panel was placed in an electroless copper bath containing; Rochelle salt, 150 g./l.; sodium hydroxide, 40 g./l.; copper sulfate, 30 g./l.; sodium carbonate, 25 g./l.; Versene T (tetra sodium salt of ethylenediaminetetraacetic acid), 10 g./l. and formaldehyde (37%), 160 ml./l. for 15 minutes. The electroless copper deposited from said bath was overplated electrolytically with 12 microns of bright, levelling copper, an equal amount of bright levelling nickel and ¼ micron of chromium to give a final bright chromium finish over the plastic and the copper insert.

We claim:

1. A process for activating the surface of a substrate preparatory to plating the same by the electroless process comprising treating said substrate with an aqueous electrolyte containing dissolved therein alkali gold sulfite adjusted to a pH of 8–14.

2. The process as claimed in claim 1 wherein said electrolyte contains about .01 to about 1 g./l. of gold sulfite calculated as gold.

3. In the process of depositing metals by the electroless process wherein the substrate is cleaned, rinsed, treated with a stannous salt solution, treated with a catalytic solution and then treated in a bath for depositing metal by the electroless process, the improvement characterized in that after treating in the stannous salt solution, and before treating to deposit metal by the electroless process, the substrate is catalyzed by treating with an aqueous solution of alkali gold sulfite.

4. The process of claim 3, wherein said aqueous solution of alkali gold sulfite contains about .01 to about 1 g./l. of gold.

References Cited

UNITED STATES PATENTS

| | | | |
|---|---|---|---|
| 3,057,789 | 10/1962 | Smith | 204—46 |
| 3,300,328 | 1/1967 | Luce | 106—1 |

ALFRED L. LEAVITT, Primary Examiner

T. E. BOKAN, Assistant Examiner

U.S. Cl. X.R.

106—1, 160, 213; 117—50, 130